(12) United States Patent
Merckling

(10) Patent No.: US 8,872,238 B2
(45) Date of Patent: Oct. 28, 2014

(54) METHOD FOR MANUFACTURING A LOW DEFECT INTERFACE BETWEEN A DIELECTRIC AND A III-V COMPOUND

(71) Applicant: IMEC, Leuven (BE)

(72) Inventor: Clement Merckling, Schaerbeek (BE)

(73) Assignee: IMEC, Leuven (BE)

( * ) Notice: Subject to any disclaimer, the term of this patent is extended or adjusted under 35 U.S.C. 154(b) by 48 days.

(21) Appl. No.: 13/654,160

(22) Filed: Oct. 17, 2012

(65) Prior Publication Data

US 2013/0043508 A1 Feb. 21, 2013

Related U.S. Application Data

(62) Division of application No. 12/896,541, filed on Oct. 1, 2010, now Pat. No. 8,314,017.

(60) Provisional application No. 61/248,310, filed on Oct. 2, 2009.

(51) Int. Cl.
*H01L 29/205* (2006.01)
*H01L 21/28* (2006.01)
*H01L 29/51* (2006.01)
*H01L 29/66* (2006.01)
*H01L 49/02* (2006.01)
*H01L 29/20* (2006.01)

(52) U.S. Cl.
CPC .......... *H01L 21/28264* (2013.01); *H01L 28/40* (2013.01); *H01L 29/20* (2013.01); *H01L 29/51* (2013.01); *H01L 29/513* (2013.01); *H01L 29/517* (2013.01); *H01L 29/66462* (2013.01)
USPC ............ 257/201; 257/532; 257/E21.097; 257/E29.09; 438/393

(58) Field of Classification Search
CPC ......... H01L 28/40; H01L 29/20; H01G 9/042
USPC .................. 257/201, 532, E21.097, E29.09; 438/393
See application file for complete search history.

(56) References Cited

U.S. PATENT DOCUMENTS

| | | | | |
|---|---|---|---|---|
| 5,370,769 | A | * | 12/1994 | Kadomura et al. ........... 438/695 |
| 6,159,834 | A | | 12/2000 | Yu et al. |
| 7,485,503 | B2 | * | 2/2009 | Brask et al. .................... 438/142 |
| 2007/0123003 | A1 | * | 5/2007 | Brask et al. .................... 438/478 |
| 2008/0003752 | A1 | * | 1/2008 | Metz et al. .................... 438/285 |

FOREIGN PATENT DOCUMENTS

WO WO97/48499 12/1997

OTHER PUBLICATIONS

Callegari, A., et al., "Unpinned Gallium Oxide/GaAs Interface by Hydrogen and Nitrogen Surface Plasma Treatment", Appl. Phys. Lett., vol. 54 (4), Jan. 23, 1989, pp. 332-334.

(Continued)

*Primary Examiner* — Allan R Wilson
(74) *Attorney, Agent, or Firm* — McDonnell Boehnen Hulbert & Berghoff LLP

(57) ABSTRACT

The present invention is related to a method for manufacturing a low defect interface between a dielectric material and an III-V compound. More specifically, the present invention relates to a method for manufacturing a passivated interface between a dielectric material and an III-V compound. The present invention is also directed to a device comprising a low defect interface between a dielectric material and an III-V compound that has improved performance.

20 Claims, 9 Drawing Sheets

(56) References Cited

OTHER PUBLICATIONS

Kim, Hyoung-Sub et al., "Inversion-Type Enhancement-Mode HfO2-Based GaAs Metal-Oxide-Semiconductor Field Effect Transistors With a Thin Ge Layer", Appl. Phys. Lett., vol. 92, 2008, pp. 032907-1-032907-3, Jan. 25, 2008.

De Souza, J.P. et al., "Inversion Mode n-Channel GaAs Field Effect Transistor With High-k/Metal Gate", Appl. Phys. Lett., vol. 92, 2008, pp. 153508-1-153508-2, Apr. 16, 2008.

Brammertz, G. et al., "Capacitance-Voltage Characterization of GaAs—Al2O3 Interfaces", Appl. Phys. Lett., vol. 93, 2008, pp. 183504-1-183504-3, Nov. 3, 2008.

Hong, M. et al., "Epitaxial Cubic Gadolinium Oxide as a Dielectric for Gallium Arsenide Passivation", Science, vol. 283, Mar. 19, 1999, pp. 1897-1900.

Martens, Koen et al., "On the Correct Extraction of Interface Trap Density of MOS Devices With High-Mobility Semiconductor Substrates", IEEE Transactions on Electron Devices, vol. 55, No. 2, Feb. 2008, pp. 547-556.

Nicollian & Brews as published in MOS (Metal Oxide Semiconductor) Physics and Technology, p. 286, Wiley, New York 1981.

Takatani, Shinichiro et al., "Structure of Chalcogen-Stabilized GaAs Interface", Mater. Res. Soc. Symp. Proc., vol. 281, 1993, pp. 677-681.

Herman, J.S. et al., "Hydrogen Sulfide Plasma Passivation of Gallium Arsenide", Appl. Phys. Lett., vol. 60, No. 6, Feb. 10, 1992, pp. 716-717.

European Search Report, European Patent Application No. 10183705, dated Dec. 28, 2010.

Suda, Jun et al., "(2×6) Surface Reconstruction of GaAs (001) Obtained by Hydrogen Sulfide Irradiation", Jpn. J. Appl. Phys., vol. 35, 1996, pp. L1498-L1500, Nov. 15, 1996.

Kawanishi, Hidenori et al., "Adsorption and Desorption of Sulfur on a GaAs (001) Surface by H2S Exposure and Heat Treatment", J. Vac. Sci. Technol. B, vol. 9, No. 3, May/Jun. 1991, pp. 1535-1539.

\* cited by examiner

● Ga　　As

● Ga　　As

METHOD FOR MANUFACTURING A LOW DEFECT INTERFACE BETWEEN A DIELECTRIC AND A III-V COMPOUND

CROSS-REFERENCE TO RELATED APPLICATIONS

This application is a divisional of U.S. patent application Ser. No. 12/896,541, filed Oct. 1, 2010, which claims priority to U.S. Provisional Patent Application No. 61/248,310, filed Oct. 2, 2009, each of which is hereby incorporated herein by reference in its entirety.

TECHNICAL FIELD OF THE INVENTION

The present invention is directed to a method for manufacturing a low defect interface between a dielectric material and an III-V compound. More specifically, the present invention relates to a method for manufacturing a passivated interface between a dielectric material and an III-V compound.

The present invention is also directed to a device comprising a low defect interface between a dielectric material and an III-V compound that has improved performance.

BACKGROUND OF THE INVENTION

Future improvements in metal-oxide-semiconductor field effect transistors (MOSFETs) performance will require high mobility (high-μ) semiconductor channels. The integration of novel materials with higher carrier mobility, to increase drive current capability, is a real challenge to overcome silicon-based CMOS. One solution is to use a germanium-based channel for pMOS combined with an III-V-based channel for nMOS. The main issues of such devices consist in obtaining low leakage current, low interface state density and high carrier mobility in the channel.

Therefore, passivation of the interface between gate oxide and Ge/III-V materials will require innovations to reach high device performances and EOT scaling. For this reason, a great technological effort is required to produce systems that yield the desired quality in terms of material purity, uniformity and interface control.

Molecular Beam Epitaxy (MBE) has been shown to be an attractive technique to fabricate such devices, due to its potential to control at an atomic scale the in-situ deposition of the high-κ oxides and also the layer at the high-μ substrates interface.

Gallium arsenide (GaAs), with its intrinsically superior electron mobility, has been considered as a good candidate for sub-15 nm node n-MOS. The high interface states density $D_{it}$ at the oxide/GaAs interface is the main origin of Fermi level pinning which disturbs the basic MOSFET-operation.

Several passivation techniques have been attempted to prevent Fermi level pinning: chalcogenide or hydrogen surface treatments as described e.g. by Callegari et al. in Appl. Phys. Lett. 93, 183504 (2008); molecular beam epitaxy-grown $Ga_2O_3(Gd_2O_3)$ oxide as described e.g. by Hong et al. in Science 283, 1897 (1999); or interfacial passivation layers such as amorphous Si or amorphous Ge as described e.g. by Kim et al. in Appl. Phys. Lett 92, 032907 (2008). Although considerable improvements have been realized in $D_{it}$ reduction, further developments are required to obtain high performance MOS devices.

U.S. Pat. No. 6,159,834 discloses growing a $GaGdO_x$ oxide epitaxially on top of an III-V substrate. The $GaGdO_x$ oxide stabilizes the surface reconstruction of the III-V substrate, which minimizes the interface stress and leads to an unpinned Fermi level. However, the method limits the integration options to the use of the specific $GaGdO_x$ which can show significant leakage.

An alternative method described by De Souza et al. in Appl. Phys. Letters 92 153508 (2008) consists of depositing an amorphous layer of silicon on top of an III-V substrate (GaAs). However, this approach does not control the stress induced in the substrate and the electron-counting that governs the Fermi level pinning at the interface.

Therefore it is desirable to find a method that will effectively passivate an III-V substrate without presenting the drawbacks as cited above and which will lead to a device with improved performance.

SUMMARY OF THE INVENTION

According to one aspect, the present invention relates to a method for manufacturing a passivated interface between a dielectric (material) and a III-V compound, wherein the method comprises (or consists of) the steps of:
 (a) providing a substrate comprising an exposed region comprising a first III-V compound; and thereupon
 (b) forming at least one intermediate layer comprising a second III-V compound; and thereafter
 (c) applying a thermal treatment in ultra-high-vacuum to the substrate such that upon reaching a first temperature ($T_1$) a surface reconstruction of the second III-V compound takes place, thereby forming a group III element-rich surface;
 (d) bringing the substrate containing the group III element-rich surface to a second temperature ($T_2$) and subjecting the group III element-rich surface to an ambient comprising a chalcogenide hydride gas, thereby forming a chalcogenide passivated surface; and
 (e) forming a dielectric layer on the chalcogenide passivated surface, thereby forming a passivated interface between the dielectric layer and the second III-V compound.

Preferably, in the method of the invention, step b) is performed under ultra-high-vacuum, and no vacuum break is applied between the steps (b) and (e).

Preferably, in the method of the invention, any of the first III-V compound or the second III-V compound is selected from the group consisting of III-V compounds comprising As, and any combinations or mixtures thereof; more preferably from the group consisting of GaAs, InGaAs, InAs, InAlAs, AlGaAs, GaAsSb, InAlAsSb, InAlAsP, InGaAsP, and any combinations or mixtures thereof. In another preferred aspect of the method of the invention, any of the first III-V compound or the second III-V compound is selected from the group consisting of InP, InSb, GaSb, AlSb, and any combinations or mixtures thereof. Even more preferably, any of the first III-V compound or the second III-V compound is selected from the group consisting of GaAs, InGaAs, InAs, and any combinations or mixtures thereof. Still more preferably, any of the first III-V compound or the second III-V compound is selected to be or comprise GaAs.

Preferably, in the method of the invention, the first III-V compound and the second III-V compound have the same chemical composition.

Preferably, in the method of the invention, the first temperature ($T_1$) is comprised between (about) 400° C. and (about) 600° C.

Preferably, in the method of the invention, the second temperature ($T_2$) is comprised between (about) 15° C. and (about) 400° C.

Preferably, in the method of the invention, the group III element-rich surface obtained in step c) exhibits a surface reconstruction with a (×4) symmetry along the azimuth.

According to a preferred aspect of the method of the invention wherein the second III-V compound comprises (or consists of) GaAs, the group III element-rich surface obtained in step c) exhibits a (4×6) symmetry.

Preferably, in the method of the invention, the chalcogenide passivated surface obtained in step d) exhibits a (2×1) symmetry.

Preferably, in the method of the invention, RHEED (Reflection High-Energy Electron Diffraction) analysis is used to monitor in real time the atomic surface reconstructions.

Preferably, in the method of the invention, the second III-V compound comprises (or consists of) GaAs, preferably GaAs (001), the first temperature ($T_1$) is comprised between (about) 580° C. and (about) 600° C., preferably between (about) 580° C. and (about) 595° C., more preferably between (about) 585° C. and (about) 595° C., even more preferably between (about) 585° C. and (about) 590° C.; and the second temperature ($T_2$) is comprised between (about) 350° C. and (about) 400° C., preferably between (about) 350° C. and (about) 380° C., more preferably between (about) 360° C. and (about) 380° C.

Preferably, in the method of the invention, the step of subjecting the group III element-rich surface to an ambient comprising a chalcogenide hydride is plasma assisted, and the second temperature ($T_2$) is room temperature (i.e. temperature comprised between about 15° C. and about 30° C.)

Preferably, in the method of the invention, the chalcogenide hydride gas is selected from the group consisting of $H_2S$, $H_2Se$, $H_2Te$, and any combinations or mixtures thereof. More preferably, the chalcogenide hydride comprises (or consists of) hydrogen sulfide ($H_2S$).

Preferably, in the method of the invention, the dielectric layer comprises (or consists of) a high-κ dielectric, which is preferably selected from the group consisting of $Al_2O_3$, $HfO_2$, DyScO, and any combinations or mixtures thereof. More preferably, the dielectric layer is selected to comprise (or consist of) $Al_2O_3$.

Preferably, in the method of the invention, step b) comprises the steps of:
    forming a first intermediate layer overlying and in contact with the exposed region;
    forming a second intermediate layer overlying and in contact with the first intermediate layer;
    forming a third intermediate layer overlying and in contact with the second intermediate layer; and
    forming a fourth intermediate layer overlying and in contact with the third intermediate layer;
wherein the first and the third intermediate layer comprise a third III-V compound, and wherein the second and the fourth intermediate layer comprise a second III-V compound.

Preferably, in the method of the invention, the third III-V compound is selected to have a large band gap.

Preferably, in the method of the invention, the second III-V compound is selected to have a narrow band gap.

Preferably, the method of the invention further comprises performing a post-deposition anneal after the step of forming the dielectric layer. More preferably, the post-deposition anneal is performed in an inert ambient.

According to another aspect of the present invention, it is provided an electronic device having a passivated interface between a dielectric material and a III-V compound, wherein the device comprises:
    a substrate comprising an exposed region comprising a first III-V compound; and thereupon
    at least one intermediate layer comprising a second III-V compound;
    a dielectric layer overlying the at least one intermediate layer comprising a second III-V compound; and
    at the interface between the second III-V compound and the high-κ dielectric, a chalcogenide passivation layer consisting essentially of chalcogenide atom-Group III atom bonds.

Preferably, in the electronic device as described above, the dielectric material comprises (or consists of) a high-κ dielectric layer, which is preferably selected from the group consisting of $Al_2O_3$, $HfO_2$, DyScO, and any combinations or mixtures thereof. More preferably, the dielectric layer is selected to comprise (or consist of) $Al_2O_3$.

In another aspect, it is provided an electronic device comprising:
    a substrate comprising an exposed region comprising a first III-V compound; and thereupon
    at least one intermediate layer comprising a second III-V compound; and
    a dielectric material layer overlying the at least one intermediate layer comprising a second III-V compound; and
    at the interface between the second III-V compound and the dielectric material layer, a chalcogenide passivation layer formed according to the method as described above.

Preferably, in the device of the invention, the at least one intermediate layer comprises:
    a first intermediate layer overlying and in contact with the exposed region;
    a second intermediate layer overlying and in contact with the first intermediate layer;
    a third intermediate layer overlying and in contact with the second intermediate layer; and
    a fourth intermediate layer overlying and in contact with the third intermediate layer;
wherein the first and the third intermediate layer comprise a third III-V compound, and wherein the second and the fourth intermediate layer comprise a second III-V compound.

Preferably, in the device of the invention, the second III-V compound is selected to have a narrow band gap.

Preferably, in the device of the invention, the third III-V compound is selected to have a large band gap.

According to still another aspect, the present invention relates to the use of a method as described above for the manufacture of an electronic device, preferably a MOSFET device or a HEMT-MOSFET device. Another aspect of the present invention relates to an electronic device, made as described herein

BRIEF DESCRIPTION OF THE DRAWINGS

All drawings are intended to illustrate some aspects and embodiments of the present disclosure. The drawings described are only schematic and are non-limiting.

FIG. 6 (b) illustrates schematically the embodiments wherein the intermediate layer consists of a first intermediate layer (3i), a second intermediate layer (3ii), a third intermediate layer (3iii) and a fourth intermediate layer (3iv).

DETAILED DESCRIPTION OF THE INVENTION

Figure 1:
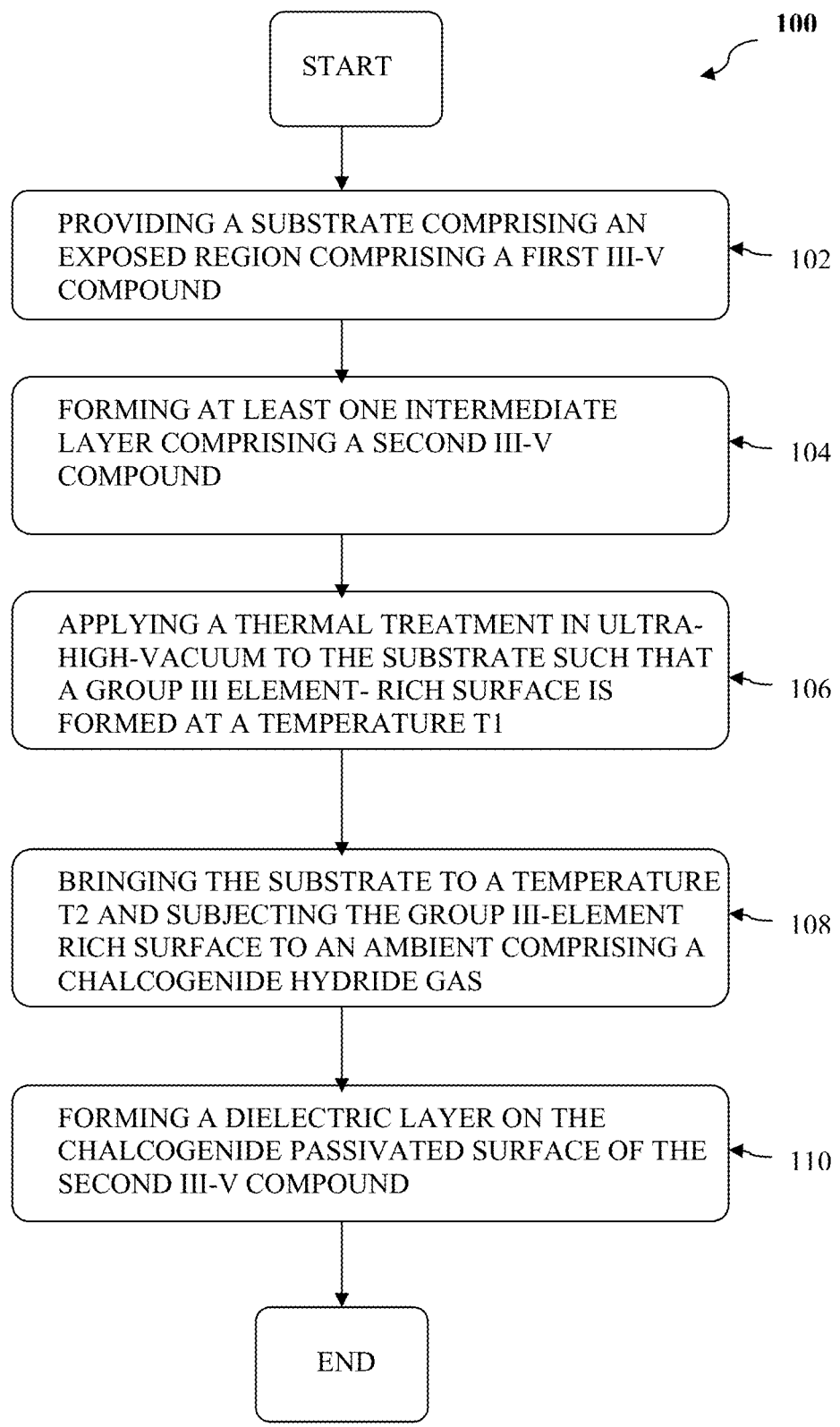
FIG. 1 illustrates schematically in a flow diagram a method of the disclosure.

One advantageous aspect of the present disclosure is the provision of a method that will effectively passivate the interface between a dielectric material and an III-V compound. Another advantageous aspect of the present disclosure is the provision of a device comprising an interface between a dielectric material and an III-V compound that has improved performance with respect to the state of the art.

Field effect devices such as field effect transistors (FET) are basic components in most digital and many analog circuits, including circuits for data processing and telecommunications.

Field effect devices typically comprise a conductive path between a source region and a drain region. The channel (which is a region of the path between the source and the drain) is controlled by the electric field produced by a gate electrode.

A HEMT (High Electron Mobility Transistor) is a field effect transistor incorporating a junction between two materials with different band gaps (i.e. a heterojunction or heterostructure) as a channel instead of a doped region, as it is generally the case for MOSFETs. A commonly used material combination is GaAs with AlGaAs, though there is wide variation, dependent on the application of the device.

According to one aspect of the present invention, it is provided a method for manufacturing a passivated interface between a dielectric material and a III-V compound, wherein the method comprises the steps of:

(a) providing a substrate comprising an exposed region comprising a first III-V compound, and thereupon (b) forming at least one intermediate layer comprising a second III-V compound and thereafter (c) applying a thermal treatment in ultra-high-vacuum to said substrate such that upon reaching a first temperature ($T_1$) a surface reconstruction of said second III-V compound takes place thereby forming a group III element-rich surface;

(d) bringing the substrate containing said group III element-rich surface to a second temperature ($T_2$) and subjecting said group III-element rich surface to an ambient comprising a chalcogenide hydride gas, thereby forming a chalcogenide passivated surface; and (e) forming a dielectric layer on said chalcogenide passivated surface, thereby forming a passivated interface between said dielectric layer and said second III-V compound.

In the context of the present disclosure, the term 'III-V compound (semiconductor)' is meant to refer to a semiconductor material that includes/comprises at least one element from Group III of the Periodic Table of Elements and at least one element from Group V of the Periodic Table of Elements. Typically, the III-V compound semiconductors are binary, ternary or quaternary alloys including III/V elements. In the context of the present disclosure non-limiting examples of III-V compound semiconductors are GaAs, InAs, InP, InSb, InGaAs, AlGaAs, InAlAs, InAlAsSb, InAlAsP and InGaAsP, GaSb, GaAsSb, AlSb.

In the context of the present disclosure, the term 'band gap' refers to the energy difference between the top of the valence band and the bottom of the conduction band. In general, a wide band gap (WBG) semiconductor is a semiconductor material with an electronic band gap larger than (about) 1.5 eV and, preferably, larger than (about) 2 eV. In general, a narrow band gap (NBG) semiconductor is a semiconductor material with an electronic band gap smaller than (about) 1 eV and, preferably, smaller than (about) 0.6 eV. However, the absolute ranges described above are only informative, since throughout this disclosure, it is rather the relative difference between the WBG and NBG that will determine the good working of the device, than the actual absolute value of the band gap.

The dielectric material having a dielectric constant of greater than (about) 3.9 (K value of SiO2) is referred to herein as a high-κ dielectric. Typically, a high-κ dielectric has a dielectric constant of about 7.0 or greater, with a dielectric constant of about 10.0 or greater being even more typical.

In the context of the present disclosure, the ultra high vacuum (UHV) conditions refer to the vacuum regime characterized by pressures lower than about $10^{-7}$ Pa or (about) 100 nPa ($10^{-9}$ mbar, $-10^{-9}$ torr).

In the context of the present disclosure, the high vacuum (HV) conditions refer to the vacuum regime characterized by pressures in between (about) $10^{-4}$ torr and (about) $10^{-6}$ torr. Reduced pressure conditions refer to a pressure range from several mtorr to (about) 100 torr.

In the context of the present disclosure, a passivated interface or a low defect interface between a dielectric (material) and an III-V compound substrate is typically showing a defect density of less than about $1 \times 10^{12}$ $cm^{-2}$ $eV^{-1}$.

In the context of the present disclosure, "exposed region" refers to that region (or layer) not covered with any another material/compound (or layer) on top of it.

In the context of the present invention, the expression "group III element-rich surface" is meant to refer to a surface wherein maximum concentration of group III element is reached while ensuring proper surface reconstruction and wherein the structural integrity of the surface is not detrimentally affected.

In the context of the present invention still, the expression "chalcogenide passivated surface", it is meant to refer to a passivated surface as defined above, wherein the passivation is operated by incorporation (preferably adsorption) of chalcogenide atoms on(to) the surface to be passivated.

GaAs(001) is the starting surface for producing the majority of III-V electronic devices worldwide. As function of the experimental growth conditions different reconstructions of the GaAs(001) surface have been reported in the scientific literature, wherein stoichiometry, temperature and ambient playing an important role.

During the deposition of the dielectric layer the stress accumulated in the III-V layer generates interface defects that pins the Fermi level of the substrate.

In general, a passivated interface or a low defect interface between e.g. a silicon oxide dielectric and a silicon substrate shows a defect density of less than about $1 \times 10^{10}$ cm$^{-2}$ eV$^{-1}$. In case of a high-κ dielectric on a silicon or germanium, substrate, a passivated interface or a low defect interface shows a defect density of less than about $1 \times 10^{11}$ cm$^{-2}$ eV$^{-1}$. However, the values reported throughout the literature are often spread, since the method used for measuring/extracting the interface state density can have an influence on the value obtained, as explained elsewhere in the description.

FIG. 1 shows a flow diagram (100) representing schematically the steps of the disclosed method.

In various preferred aspects of the disclosure, there is no vacuum break between the steps (b) and (e). In other words, the substrate is kept under a controlled ambient during the process steps (104), (106), (108) and (110) and in between these process steps during transfers.

In the context of the disclosure, depending on the process step, the controlled ambient can be high vacuum or ultra-high vacuum or an inert gas at reduced pressure. In practice, the controlled ambient can be realized in a closed unit such as a process chamber or a transfer chamber or a front-opening-unified-pod (FOUP) for wafer storage.

Preferably, between the process steps (104) and (106) and between the process steps (106) and (108) the substrate is kept under ultra high vacuum (UHV).

Preferably, between the process steps (108) and (110) the substrate is kept under high vacuum (HV).

In the context of the present disclosure, the substrate may further comprise, underneath/surrounding the exposed region Si, Ge, SiGe, sapphire, Silicon on Insulator (SOI), Germanium on Insulator (GeOI), glass, quartz, plastic, metal or any other material suitable as support in semiconductor manufacturing. Furthermore, the substrate can be a composite substrate comprising a combination of materials, for example in the form of a layered structure wherein each layer corresponds to a different material. Furthermore, the substrate can comprise patterned regions, such as e.g. shallow trench isolations (STI) regions defined on a bulk Si wafer.

In some embodiments/aspects of the disclosure, the first III-V compound and the second III-V compound have the same chemical composition and/or stoichiometry.

Advantageously, in one embodiment, prior to forming the at least one intermediate layer a native oxide removal step (dezoxidation) is performed. The native oxide removal on the exposed region comprising the first III-V compound can be done either by e.g. a reactive removal step in an ambient comprising H at reduced pressure or by a thermal treatment under As in high vacuum. Conditions and techniques for performing the native oxide removal step on the exposed region comprising the first III-V compound may be easily apparent to those skilled in the art of semiconductor processing.

During the native oxide removal step, a surface reconstruction of the first III-V compound takes place.

In one preferred aspect of the present invention, the first III-V (semiconductor) compound is selected from the group consisting of III-V compounds comprising As, and any combinations or mixtures thereof; more preferably from the group consisting of GaAs, InGaAs, InAs, InAlAs, AlGaAs, GaAsSb, InAlAsSb, InAlAsP, InGaAsP, and any combinations or mixtures thereof. In another preferred aspect of the method of the invention, the first III-V compound is selected from the group consisting of InP, InSb, GaSb, AlSb, and any combinations or mixtures thereof. Even more preferably, the first III-V compound is selected from the group consisting of GaAs, InGaAs, InAs, and any combinations or mixtures thereof. Still more preferably, the first III-V (semiconductor) compound is selected to be or comprise GaAs, more preferably GaAs(001).

Figure 2A:
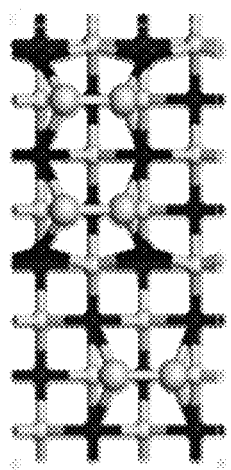
FIG. 2 represents the (2×4) GaAs(001) As-rich surface formed as a result of a surface reconstruction upon removing the native oxide in As ambient: (a) top view; (b) cross view.
Figure 2B:
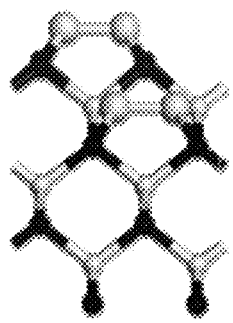

In the embodiments/aspects wherein the first III-V compound is GaAs(001), the native oxide removal is performed at about 580° C. under As, at a pressure of about $10^{-6}$ torr. As a result a (2×4) surface reconstruction takes place as shown in FIG. 2(a) (top view) and FIG. 2(b) (cross view). The main features of the (2×4) GaAs(001) reconstructed surface are the parallel rows of trenches, separated by blocks made up of top-layer As dimers sitting on second-layer Ga atoms.

Subsequently, the cleaned substrate after native oxide removal is transferred under high vacuum conditions to a deposition chamber wherein the at least one intermediate layer comprising a second III-V compound is deposited or grown.

Suitable techniques and experimental conditions to form the at least one intermediate layer comprising a second III-V compound will be easily apparent to those skilled in the art of semiconductor processing. Advantageously, Group V element-rich conditions (e.g. pressure, temperature) may be used to form the at least one intermediate layer comprising a second III-V compound.

The at least one intermediate layer can be deposited in a chemical vapor deposition chamber (e.g. MOCVD) or in a molecular beam deposition (MBD) chamber.

After forming the at least one intermediate layer the substrate is transferred under high vacuum conditions to a UHV pre-treatment chamber. Preferably, the transfer is performed under ultra-high vacuum, at a pressure lower than $10^{-8}$ torr.

In the UHV pre-treatment chamber a thermal treatment to a first temperature ($T_1$) is performed in order to produce a surface reconstruction of the second III-V compound with the formation of a group III-element rich surface.

Identifying, achieving and characterizing suitable surface reconstruction of the second III-V compound, as well as forming a group III-element rich surface, is well within the capabilities of those skilled in the art, in the light of the present disclosure. In that context, identifying a suitable first temperature ($T_1$) for achieving a surface reconstruction of a specific second III-V compound and thereby forming a group III element-rich surface, is also well within the capabilities of those skilled in the art of semiconductor processing, in the light of the present disclosure.

In the context of the invention, the first temperature ($T_1$) is typically comprised between 400° C. and 600° C., depending on the second III-V compound which is deposited or grown. According to the particular aspect wherein the second III-V compound comprises GaAs, the first temperature ($T_1$) is preferably comprised between 580° C. and 600° C. According to the particular aspect wherein the second III-V compound comprises InGaAs (in particular $In_{0.53}Ga_{0.47}As$), the first temperature ($T_1$) is preferably comprised between 500° C. and 520° C. According to the particular aspect wherein the second III-V compound comprises InAs, the first temperature ($T_1$) is preferably comprised between 420° C. and 440° C.

Suitable techniques and experimental conditions to form a group III-element rich surface will be easily apparent to the skilled person. In the context of the invention, forming a group III-element rich surface may be achieved by applying a thermal treatment (reaching the first temperature $T_1$) to the substrate, thereby inducing evaporation or desorption of group V element atoms from the layer comprising the second III-V compound. Alternatively, forming a group III-element rich surface may be achieved by depositing a layer comprising group III element directly onto the layer comprising the second III-V compound at temperature ($T_1$), and preferably under ultra high vacuum conditions.

Figure 3A:
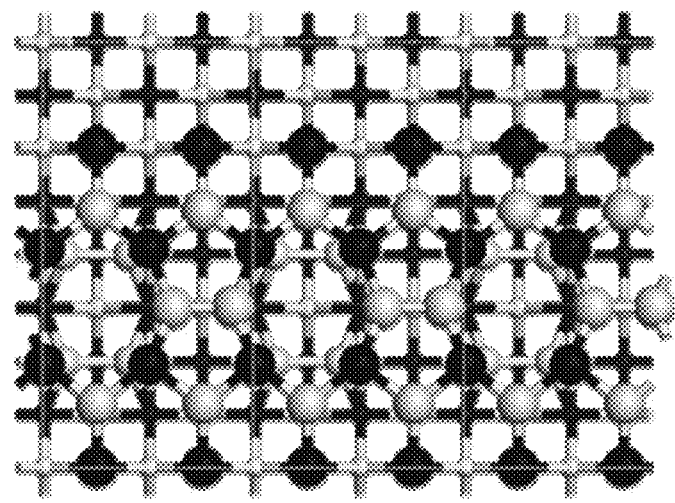
FIG. 3 represents the (4×6) GaAs(001) Ga-rich surface formed as a result of a thermal treatment in ultra high vacuum at 580° C.: (a) top view; (b) cross view.
Figure 3B:
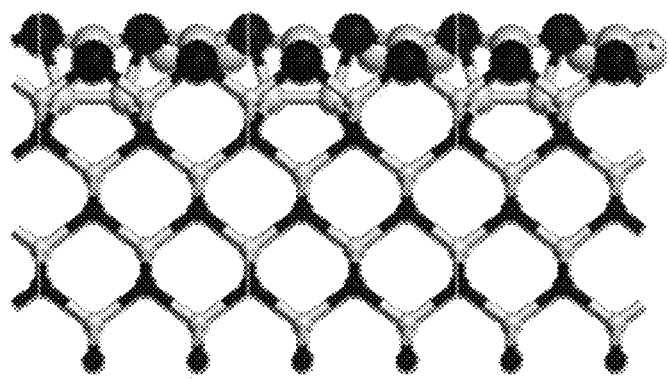

In the context of the present invention, RHEED (Reflection High-Energy Electron Diffraction) analysis is preferably used to monitor in real time the atomic surface reconstructions. Advantageously, and in the context of a preferred aspect of the method of the invention, RHEED analysis is performed only once for each second III-V compound to establish the suitable first and second temperatures while monitoring the reconstruction of the second III-V compound layer occurring in step c) and, respectively, d) of the method of the invention. In the embodiments/aspects wherein the second III-V compound is p-type GaAs(001), the surface reconstruction at about 580° C. in UHV leads to the formation of a (4×6) Ga-rich surface as shown in FIG. 3(a) (top view) and FIG. 3(b) (cross view). The first temperature ($T_1$) can range in this specific embodiment between 580° C. and 600° C., more preferably between 580° C. and 590° C.

In the context of the present invention, and without being bound by theory, it is generally preferred that the surface reconstruction of the second III-V compound that takes place in step c) of the method of the invention, leads to forming a group III element-rich surface having a surface reconstruction with a (×4) symmetry along the [110] azimuth.

Subsequently, the group III element-rich surface is brought to a second temperature ($T_2$), preferably lower than the first temperature ($T_1$), and subjected to a chalcogenide hydride gas treatment. Advantageously, the chalcogenide hydride gas treatment can be performed in the same process chamber with the UHV pre-treatment (UHV pre-treatment chamber).

The chalcogenide atoms are adsorbed on the group III element-rich surface leading to the formation of a chalcogenide-passivated surface.

Suitable techniques and experimental conditions to have group III-element rich surface subjected to a chalcogenide hydride gas treatment will be easily apparent to the skilled person.

Obtaining and characterizing the forming of a chalcogenide-passivated surface, is well within the capabilities of those skilled in the art, in the light of the present disclosure. In that context, identifying a suitable second temperature ($T_2$) for achieving a chalcogenide-passivated surface, is also well within the capabilities of those skilled in the art of semiconductor processing in the light of the present disclosure. Advantageously, a suitable temperature ($T_2$) will be preferably that temperature which ensures sufficient breaking of the chalcogenide hydride molecule chemical bonds, while preserving sufficient sticking coefficient of the chalcogenide hydride on the surface to be treated.

In the context of the invention, the second temperature ($T_2$) is typically comprised between 15° C. and 400° C., depending on the choice of second III-V compound.

According to the particular aspect wherein the group III-element rich surface comprises GaAs, the second temperature ($T_2$) is preferably comprised between 350° C. and 380° C., preferably between 360° C. and 380° C. According to the particular aspect wherein the group III-element rich surface comprises InGaAs (in particular $In_{0.53}Ga_{0.47}As$), the second temperature ($T_2$) is preferably comprised between 25° C. and 75° C. According to the particular aspect wherein the group III-element rich surface comprises InAs, the second temperature ($T_2$) is preferably comprised between 25° C. and 75° C.

Figure 4A:
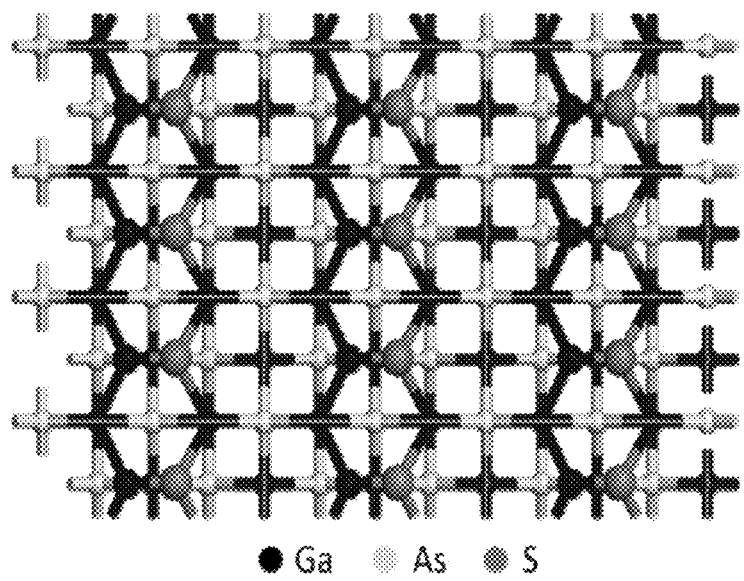
FIG. 4 represents the (2×1) S containing p-GaAs(001) surface upon the $H_2S$ treatment (a) top view; (b) cross view; (c) S—Ga dimers present on the Ga-rich surface.
Figure 4B:
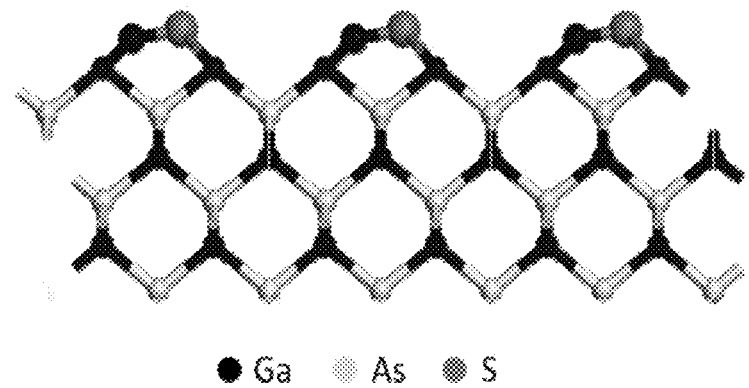

In some embodiments/aspects of the disclosure wherein a (4×6) GaAs(001) Ga-rich reconstructed surface is subjected to a chalcogenide hydride gas and upon chalcogen adsorption, a (2×1) structure is formed, as schematically shown in FIG. 4 (a) (top view) and FIG. 4(b) (cross-view). More specifically, the chalcogenide-passivated surface (i.e. the chalcogenide-GaAs surface) exhibits (2×1) symmetry. The second temperature ($T_2$) can range in these embodiments/aspects between 350° C. and 400° C., preferably between 350° C. and 380° C.

In the context of the present, and without being bound by theory, it is generally preferred that the chalcogenide passivated surface (i.e. chalcogenide-second III-V compound surface) obtained in step d) of the method of the invention exhibits a (2×1) symmetry.

In different embodiments/aspects of the disclosure, the chalcogenide hydride gas comprises $H_2S$, $H_2Se$, $H_2Te$ or combinations thereof. In a preferred aspect, the chalcogenide hydride gas is selected from the group consisting of $H_2S$, $H_2Se$, $H_2Te$, and any combinations or mixtures thereof. Preferably the chalcogenide hydride is (or comprises) hydrogen sulfide ($H_2S$).

A controlled flow of chalcogenide hydride gas is supplied through a gas inlet. The pressure in the pre-treatment chamber and the exposure time to chalcogenide hydride gas are both controlled such as their product is equivalent with about $3.5 \times 10^3$ L, wherein 1 L (langmuir) is a unit of exposure (dosage) and corresponds to an exposure of $10^{-6}$ torr during 1 second. In a particular example, the pressure in the pre-treatment chamber in the presence of the chalcogenide hydride gas was $2 \times 10^{-6}$ torr and the exposure time was 45 minutes. Different combinations of exposure time in the range from 1 minute up to 1 hour and pressures values in the range from $1 \times 10^{-3}$ torr to $1 \times 10^{-6}$ torr can be used, a shorter exposure time being more advantageous for manufacturing.

Figure 4C:
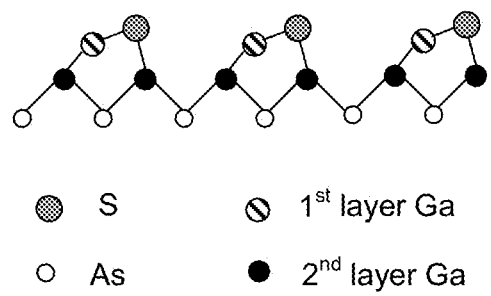

FIG. 4(c) shows in detail a possible mechanism behind the sulphur adsorption with the formation of the S—Ga dimers on the Ga-rich surface. Following this reasoning, as a result of $H_2S$ treatment, sulfur atoms are bonded exclusively with gallium atoms. The (2×1) symmetry for S—GaAs(2×1) surface can be explained by the alignment of S—Ga dimers into rows, resulting in a (2×1) surface periodicity. This model suggests that only S—Ga bonds are formed at the temperature used for the $H_2S$ exposure.

By way of generalization, and without wishing to be bound by theory, it is believed that a mechanism behind the chalcogenide atoms adsorption goes through the formation of chalcogenide-group III element dimers on the group III element-rich surface. Also, and as a result of the chalcogenide hydride gas treatment, it is believed that the chalcogenide atoms are bonded exclusively with group III element atoms.

Advantageously, the chalcogenide (e.g. sulfur)-passivated surface is well ordered, thermodynamically stable and neutral from an electron counting point of view. Therefore, the chalcogenide (e.g. sulfur)-passivated surface can function as a low defect density interface whereupon a high-κ dielectric can be directly deposited. Moreover, the (2×1) surface reconstruction is stable after the chalcogenide hydride gas (e.g. $H_2S$) flow is discontinued.

Further, upon adsorbing the chalcogenide (e.g. S) atoms on the group III-element rich surface and forming the chalcogenide-passivated surface the substrate is transferred preferably without vacuum break to a dielectric deposition chamber.

More preferably, the substrate is transferred to a dielectric deposition chamber under high vacuum conditions, at a pressure lower than $10^{-5}$ torr.

Advantageously, the controlled adsorption of chalcogenide (e.g. S, Se, Te) atoms on the III-V compound surface preserves the type of the III-V reconstructed surface (element III-rich) and avoids the oxidation of the semiconductor during the subsequent deposition of the high-κ dielectric.

Different embodiments/aspects of the disclosure disclose a high-κ dielectric deposited on the chalcogenide passivated surface. The substrate is transferred from the UHV pre-treatment chamber to the dielectric deposition chamber without vacuum break. The high-κ dielectric material can be deposited by Atomic Layer Deposition (ALD), Metal-organic Chemical Vapor Deposition (MOCVD), molecular beam deposition (MBD) or any other technique suitable to form thin dielectric films. The deposition temperature can vary between 50° C. and 350° C.

Figure 5:
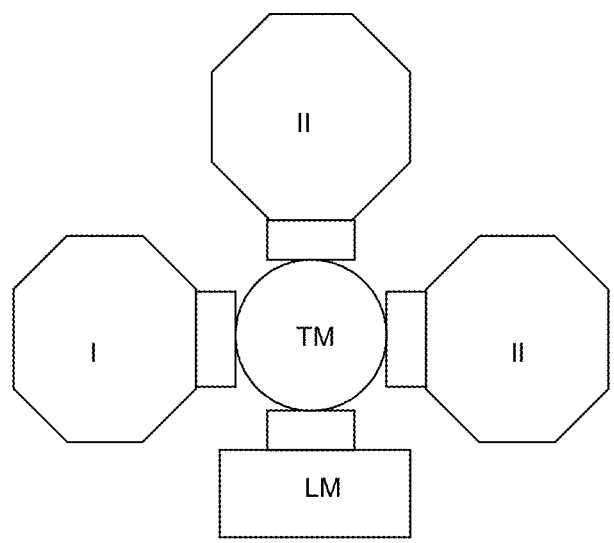
FIG. 5 represents schematically a cluster tool suitable to perform the method of the disclosure, comprising: (I) III-V deposition/growth chamber; (II) pre-treatment UHV chamber; (III) high-κ dielectric deposition chamber; (TM)—transfer module with controlled ambient; (LM)—load module.

FIG. 5 represents schematically a cluster tool suitable to perform the method of the disclosure comprising a III-V deposition/growth chamber (I), a pre-treatment UHV chamber (II), a dielectric deposition chamber (III), a transfer module with controlled ambient (TM) and a load module (LM).

Different embodiments/aspects disclose that the second III-V compound is selected to have a narrow band gap (NBG) as defined elsewhere in the description.

In specific embodiments of the disclosure the second III-V compound having a narrow band gap is $In_xGa_yAs$, wherein $0<x, y<1$ and $x+y=1$. The later has the additional advantage that is lattice matched to InP(001), which makes the InP(001) an appropriate choice for the first III-V compound underlying the intermediate layer.

In the embodiments/aspects wherein the second III-V compound is $In_xGa_yAs$ the first temperature (of the UHV pre-treatment) is preferably about 450° C.

In some embodiments/aspects of the disclosure the step of subjecting the group III-element rich surface to an ambient comprising a chalcogenide hydride is plasma assisted. The RF power and the flow/pressure of the chalcogenide hydride during the plasma assisted treatment can be varied to promote the chalcogenide adsorption while avoiding surface damage.

In the embodiments wherein a plasma treatment is applied the second temperature can be lower than 300° C. More preferably, the second temperature can be room temperature (15° C.-30° C.).

In a particular example, the plasma treatment is applied at room temperature on an intermediate layer comprising $In_{0.53}Ga_{0.47}As$. The combination between plasma assisted treatment and low temperatures has the additional advantage of avoiding any undesirable native oxide formation at the interface that may occur at temperatures higher than 100° C.

In some embodiments/aspects of the disclosure the step (b) of forming at least one intermediate layer further comprises:

forming a first intermediate layer (3i) overlying and in contact with the exposed region, forming a second intermediate layer (3ii) overlying and in contact with the first intermediate layer, forming a third intermediate layer (3iii) overlying and in contact with the second intermediate layer and forming a fourth intermediate layer (3iv) overlying and in contact with the third intermediate layer, wherein the first and the third intermediate layer comprise a third III-V compound, and wherein the second and the fourth intermediate layer comprise a second III-V compound.

The first intermediate layer preferably comprises a third III-V compound selected to have a large band gap (LBG) and which is preferably suitable to function as a buffer layer in a HEMT or HEMT-MOSFET device.

The second intermediate layer preferably comprises a second III-V compound selected to have a narrow band gap (NBG) and which is preferably suitable to function as a channel layer in a HEMT or HEMT-MOSFET device.

The third intermediate layer preferably comprises a third III-V compound selected to have a large band gap (LBG) and which is preferably suitable to function as a barrier layer in a HEMT or HEMT-MOSFET device.

The fourth intermediate layer preferably comprises a second III-V compound selected to have a narrow band gap (NBG). The fourth intermediate layer is preferably a thin layer, having preferably a thickness equivalent with less than 5 monolayers of the NBG material, preferably less than 3 monolayers of the NBG material. In embodiments of the disclosure wherein the equivalent oxide thickness (EOT) should be minimized, the thickness can be further reduced to the equivalent of about 1 monolayer of the NBG material.

In the embodiments/aspects wherein several intermediate layers are deposited, it is the last (the uppermost) intermediate layer which will undergo a surface reconstruction to form an element III-rich surface.

Subsequently, after the exposure to the chalcogenide hydride gas, a chalcogenide passivated surface is formed on the element III-rich surface.

In some embodiments/aspects of the disclosure, the second III-V compound comprises $In_xGa_yAs$ with $0<x, y<1$ and $(x+y)=1$ and the third III-V compound is selected from the group consisting of $In_xAl_yAs$ and $Al_xGa_yAs$, with $0<x, y<1$ and $(x+y)=1$ or other III-V compound with similar properties.

In particular embodiments/aspects of the disclosure wherein the second III-V compound comprises $In_xGa_yAs$ with a low amount of In ($x<0.4$), the third III-V compound comprises $Al_xGa_yAs$ and the first III-V compound (part of the substrate) comprises GaAs.

In particular embodiments/aspects of the disclosure wherein the second III-V compound comprises In rich ($x>=0.4$) $In_xGa_yAs$, the third III-V compound comprises $In_xAl_yAs$ and the first III-V compound (part of the substrate) comprises InP.

Embodiments/aspects of the disclosure reveal forming a dielectric layer comprising a high-κ dielectric, overlying the chalcogenide-passivated surface. The chalcogenide-passivated surface is compatible with all high-κ materials leaving unlimited choice to the integration process to be used.

Some non-limiting examples of high-κ dielectrics are $Al_2O_3$, $HfO_2$, DyScO or combinations thereof. According to a preferred aspect of the invention, the high-κ dielectric is selected to be (or comprise) $Al_2O_3$.

The method of the disclosure may further comprise performing a post-deposition anneal after forming the high-κ dielectric layer.

In specific embodiments/aspects the post deposition anneal is performed in $N_2$ at about 600° C. In alternative embodiments $N_2$ can be replaced by any other inert gas, e.g. a noble gas.

The method of the disclosure is advantageously leading to a chalcogenide-passivated surface which is stable (no interface degradation observed) during the post-processing at temperatures lower than 650° C., preferably lower than 600° C.

In another aspect of the disclosure, the use of the method described above is disclosed to produce an electronic device such as a MOSFET device or a HEMT-MOSFET device.

In yet another aspect of the present disclosure, an electronic device is disclosed comprising a chalcogenide passivated interface, comprising:

a substrate (1) comprising an exposed region (2) comprising a first III-V compound, and thereupon at least one intermediate layer (3) comprising a second III-V compound and a high-κ dielectric layer (5) overlying the at least one intermediate layer (3), wherein at the interface between the second III-V compound and the high-κ dielectric, a chalcogenide passivation layer (4) is formed consisting essentially of chalcogenide element-group III element bonds.

Figure 6A:
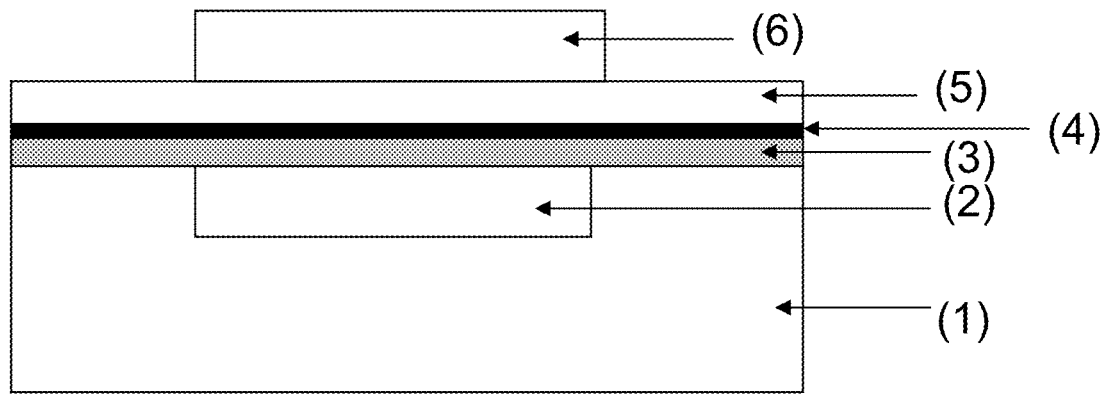
FIG. 6 (a) shows schematically a MOS capacitor structure comprising a passivated interface according with the disclosure: (1) substrate; (2) exposed first III-V compound; (3) intermediate layer; (4) chalcogenide passivation layer; (5) high-κ dielectric layer; (6) electrode.
Figure 6B:
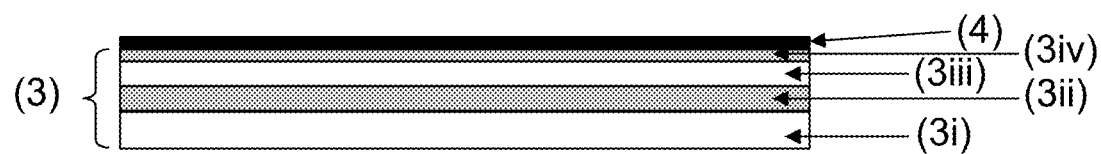

FIG. 6 (*a*) illustrates schematically a MOS capacitor comprising the passivated interface of the disclosure. The substrate (1) comprises an exposed region (2) comprising a first III-V compound. An intermediate layer (3) comprising a second III-V compound is overlying the exposed region (2). At the interface between the second III-V compound and the high-κ dielectric (5) a chalcogenide passivation (surface) layer (4) is formed.

In other embodiments of the disclosure more than one intermediate layer is used as illustrated schematically in FIG. 6 (*b*). The electronic device further comprises:

a first intermediate layer (3*i*) overlying and in contact with the exposed region a second intermediate layer (3*ii*) overlying and in contact with the first intermediate layer a third intermediate layer (3*iii*) overlying and in contact with the second intermediate layer and a fourth intermediate layer (3*iv*) overlying and in contact with the third intermediate layer and wherein the first and the third intermediate layer comprise a third III-V compound, and wherein the second and the fourth intermediate layer comprise a second III-V compound.

Further in different embodiments/aspects of the disclosure, the second III-V compound is selected to have a narrow band gap, being suitable to form e.g. a channel layer in a HEMT or MOSFET-HEMT device.

Furthermore, in different embodiments/aspects of the disclosure, the third III-V compound is selected to have a large band gap, being suitable to form e.g. a barrier or a buffer layer in a HEMT or MOSFET-HEMT device.

The chalcogenide-passivated layer (surface) is at most one monolayer thick and consists essentially of chalcogenide element-group III element bonds (e.g. S—Ga). The chalcogenide-passivated layer has a practically negligible contribution to the equivalent oxide thickness (EOT) of a dielectric stack defined hereupon, making it suitable for the manufacturing of scaled devices with low EOT.

EXAMPLES

Growth of $Al_2O_3$/S—GaAs (001) heterostructures was carried out using a molecular beam epitaxy multi-chamber cluster system. The different chambers were connected with a common transfer unit. The chambers and the transfer unit were kept under UHV with a base pressure of $10^{-11}$ torr. The base (background) pressure is the pressure in a process chamber before supplying any gas.

The intermediate GaAs layers were grown on p-type (001)-oriented GaAs substrates. The GaAs substrates were heated first to 580° C. under As-rich conditions at a pressure of about $2 \times 10^{-5}$ torr, to remove the native oxide. The intermediate GaAs layer had a thickness of about 0.3 μm and were doped with Be with a concentration of about $5 \times 10^{16}$ cm$^{-3}$. The intermediate GaAs layers were grown at 580° C., at a growth rate of about 0.5 ML·s$^{-1}$ and under As-rich conditions at a pressure of about $1.8 \times 10^{-5}$ torr. As a result of the growth conditions the intermediate GaAs layers show a (2×4) surface reconstruction.

At the end of the growth step, the substrate temperature was cooled down under As and stabilized at about 350° C. Upon cooling down a GaAs(001)-c(4×4) reconstructed and arsenic-rich surface was formed.

Subsequently to the growth step, the GaAs(001) substrate was transferred under UHV into the UHV pre-treatment (passivation) chamber. The sample was heated up in UHV to 580° C. for 5 min to form the Ga-stabilized (4×6) surface reconstruction and, thereafter, cooled down to 350° C. At this temperature the surface was exposed to a $H_2S$ molecular flow at a pressure of $2 \times 10^{-6}$ torr for 30 minutes. As a results of the $H_2S$ exposure a (2×1) reconstructed surface is formed.

Finally the sample was transferred under high vacuum into the dielectric deposition chamber, where a high-κ dielectric deposition was performed by molecular beam deposition. Alternative deposition techniques such as atomic layer deposition (ALD), metal-organic chemical vapour deposition (MOCVD) can be also used. The high-κ dielectric deposited in the specific example was $Al_2O_3$. Thin films of $Al_2O_3$ were formed by co-deposition of aluminium evaporated from a double filament Knudsen cell with an atomic oxygen flux at a pressure $p(O_{atomic}) \sim 3 \times 10^{-6}$ torr from an Oxford plasma source. During the deposition, the substrate temperature was about 250° C. in order to obtain an amorphous layer.

Further, MOS capacitors were formed by depositing a top electrode (6, FIG. 6*a*) upon the high-κ dielectric layer, the top electrode consisting of a Ni layer with a thickness of 50 nm. The top electrode was ex-situ deposited through a shadow mask. The back side Ohmic contact was formed using a composite stack of 30 nm Au and 70 nm AuZn. Prior to metal deposition samples were annealed for 60 minutes at 550° C. in a molecular nitrogen environment.

During all the MBE process steps, RHEED analysis (illustrated in FIG. 7) was used to monitor in real time the atomic surface reconstructions. After the growth of the GaAs(Be) intermediate layer, the surface exhibits a clean As-rich c(4×4) surface as shown in FIG. 7.

GaAs surfaces with different [V]/[III] surface stoichiometries can be achieved by slowly heating the substrate under UHV leading to desorption of the arsenic atoms. By increasing the substrate temperature in the passivation chamber, the RHEED pattern subsequently change from the initial As-rich c(4×4) surface to (2×4) reconstruction at 440° C., Ga-rich (3×6) at 520° C. and finally a (4×6) surface reconstruction at 580° C. as shown in FIG. 7. The (4×6) surface reconstruction is mostly terminated by gallium atoms. The high temperature (580° C.) is maintained only for few minutes to avoid any surface damages.

Subsequent to the high temperature treatment, the temperature is ramped down to 350° C. The RHEED studies confirm that the (4×6) surface periodicity is kept at temperatures as low as 350° C. as shown in FIG. 7. In this way the high-quality and the stability of the Ga-rich surface is confirmed.

Figure 7:
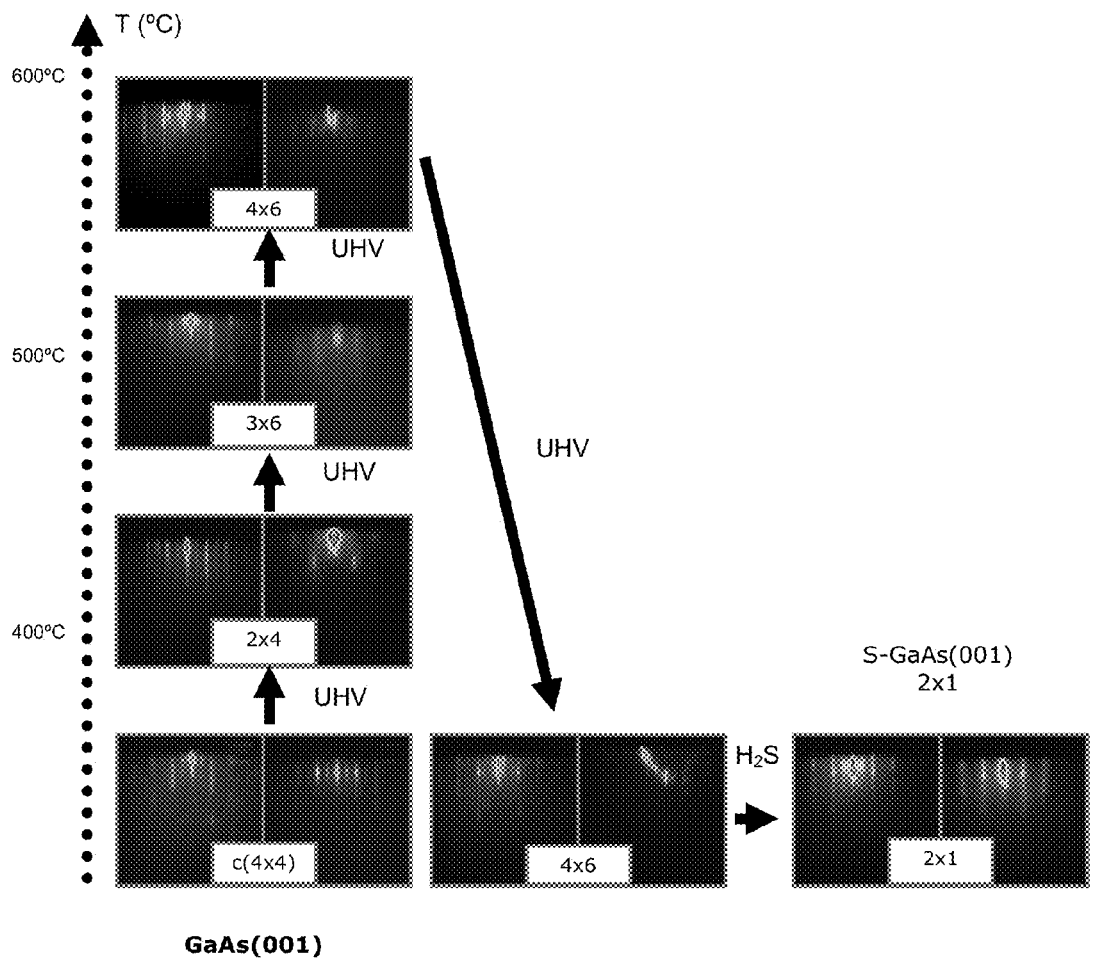
FIG. 7 represents the RHEED (Reflection High-Energy Electron Diffraction) patterns recorded in-situ along [110] and [1-10] azimuths that illustrate the different surface reconstructions and the sulfur adsorption, according to the method of the disclosure.

Sulphurization by hydrogen sulphide at 350° C. results in a "(4×6)-to-(2×1)" surface periodicity transition as shown in FIG. 7. As a result of $H_2S$ treatment, sulphur atoms are bonded exclusively with gallium atoms. The (2×1) symmetry for S—GaAs(2×1) passivated surface can be explained by a model wherein S—Ga dimers are aligned into rows, resulting in a (2×1) surface periodicity. The relative high temperature of the sulphur treatment/exposure virtually removes all S—As bonds from the surface, leaving only S—Ga bonds. The sulphur-passivated surface obtained with the method of the disclosure is well ordered, thermodynamically stable and neutral from an electron counting point of view. Moreover, the (2×1) S—GaAs(001) passivated surface is stable after the H$_2$S molecular flow is discontinued. All these properties make the sulphur-passivated surface S—GaAs(001) of the disclosure a very promising low defect density interface, suitable to be combined with a high-κ oxide deposition.

The passivation efficiency of the high-κ dielectric/III-V interface was evaluated by electrical characterization, especially capacitance-voltage (C-V) and conductance-voltage (G-V) measurements.

Although the C-V characterization method for deducing interface state densities works well for Si MOS structures, the situation is completely different for GaAs MOS structures, due to the larger bandgap of GaAs with respect to Si. In the common used measurement conditions (room temperature with frequency between 100 Hz-1 MHz), interface trapping states are only measured in a very small portion of the GaAs band gap. This implicates that the extremely important mid-gap region in not properly probed at room temperature.

To solve this problem, an additional C-V measurement of the GaAs MOS structures was performed at 150° C. In this case a consistent mid-gap interface state density $D_{it}$ extraction can be done based on the conductance method from Nicollian and Brews as published in MOS (Metal Oxide Semiconductor) Physics and Technology, p. 286, Wiley, New York (1981).

Figure 8A:
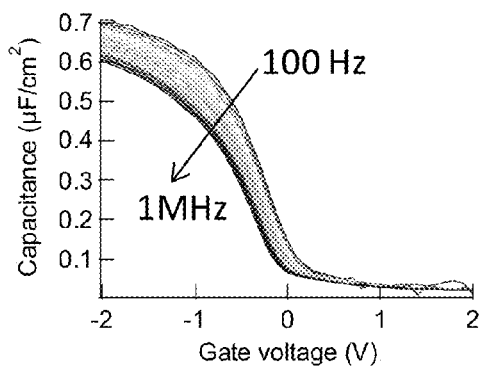
FIG. 8 represents room temperature C-V plots, measured at 25° C. with frequency range from 100 Hz to 1 MHz, corresponding to (a) capacitors without $H_2S$ surface treatment and (b) capacitors with $H_2S$ surface treatment prior to $Al_2O_3$ oxide deposition.
Figure 8B:
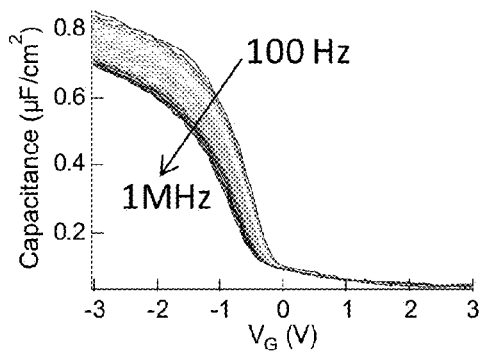

FIGS. 8($a$) and 8($b$) represent room temperature C-V curves, measured at 25° C. with frequency range from 100 Hz to 1 MHz, corresponding to capacitors without and, respectively, with H$_2$S surface treatment prior to Al$_2$O$_3$ oxide deposition.

Figure 9A:
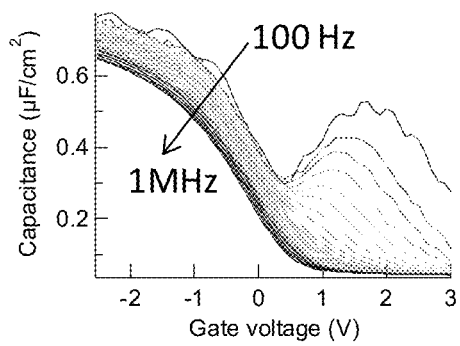
FIG. 9 represents high temperature C-V plots, measured at 150° C. with frequency range from 100 Hz to 1 MHz, corresponding to (a) capacitors without $H_2S$ surface treatment and (b) capacitors with $H_2S$ surface treatment prior to $Al_2O_3$ oxide deposition.
Figure 9B:
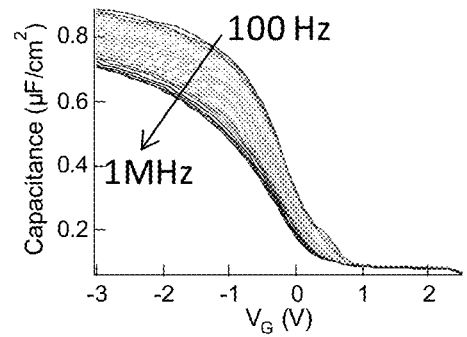

FIGS. 9($a$) and 9($b$) present high temperature C-V curves, measured at 150° C. with frequency range from 100 Hz to 1 MHz, corresponding to capacitors without and, respectively, with H$_2$S surface treatment prior to Al$_2$O$_3$ oxide deposition.

The leakage current densities (J-V) through the 9 nm-thick Al$_2$O$_3$ dielectric, of both MOS heterostructures, measured at 25° C. and 150° C. are relatively low showing $J_L$ of about $10^{-9}$ A/cm$^{-2}$ at −1 V. These preliminary electrical results secure the further C-V analysis and the calculation of interface state densities ($D_{it}$) which can only be made for devices presenting extremely low leakage currents.

In each case, room temperature measurements (FIGS. 8 $a$) and $b$)) give acceptable C-V behaviour with low frequency dispersion in accumulation and depletion. The residual frequency dispersion on both curves is not due to interface states, but a consequence of bulk defects located in the III-V substrate.

Nevertheless, even if the GaAs/Al$_2$O$_3$ heterostructure present acceptable room temperature C-V shape, high temperature C-V measurements indicate the true nature of this interface. It shows large bumps in depletion for the lower frequencies as shown in FIG. 9($a$). Such conduct is generated by interface states in high quantity which evidences the pinning of the Fermi level in the mid-gap energy region.

On the contrary, the sulphur-passivated interface in the S—GaAs-(2×1)/Al$_2$O$_3$ MOS structure, characterized at room and high temperatures, display very good C-V profile with low frequency dispersion in accumulation and depletion as shown in FIG. 8($b$) and FIG. 9($b$).

For the sulphur-passivated interface, the high temperature C-V curve, used to probe the mid-gap $D_{it}$ spectrum, only exhibit an ultra low feature at lower frequencies in depletion. Moreover, the initial shape of the C-V is conserved, no stretch-out or flatband voltage dependency has been observed on the characteristic. From this analysis, it is significant to conclude that the sulphur passivation method of the disclosure leads to a substantial interfacial defect reduction.

Additional experiments have been carried out involving growth of Al$_2$O$_3$/S—GaAs(001) heterostructures using a molecular beam epitaxy cluster production system.

The GaAs layers were grown on p-type and n-type (001)-oriented GaAs epi-ready substrates. The ~0.3 μm-GaAs buffer layer [Be or Si doped at 5×10$^{16}$ cm$^{-3}$] were grown at 580° C., at a growth rate of 0.5 ML·s$^{-1}$. Next, the substrate temperature was reduced under arsenic pressure and stopped below 350° C., leading to a GaAs(001)-c(4×4) reconstructed and arsenic-rich surface.

At the end of the buffer layer growth, the GaAs(001) substrate was transferred into the passivation chamber. The sample was heated up in UHV to 580° C. for 5 min to form the Ga-stabilized (4×6) surface reconstruction and cooled down to 350° C. At this temperature, the surface was exposed to H$_2$S at a pressure of 2×10$^{-6}$ Torr for 30 minutes, resulting in a (2×1) reconstructed surface.

Finally, the sample was introduced into the high-κ chamber to perform the molecular beam deposition of the high-κ dielectric. The Al$_2$O$_3$ thin films were elaborated by co-deposition of aluminium with oxygen from an oxygen plasma at an overall pressure of 3×10$^{-6}$ Torr. During the deposition, the substrate temperature was around 250° C. in order to obtain an amorphous layer. MOS capacitors were made by means of 150 nm Ni metal dots through a shadow mask. The back side Ohmic contact was formed using a composite stack of 30 nm of Au followed by 70 nm of AuZn. Prior to metal deposition, samples were annealed at 550° C. for 60 min in a molecular nitrogen environment.

During the different MBE process steps, RHEED analysis is used to monitor in real time the atomic surface reconstructions. By increasing the substrate temperature up to 580° C. in the passivation (UHV) chamber, the RHEED pattern progressively changes from the initial As-rich c(4×4) of the 0.3 μm-thick GaAs buffer layer to a Ga-rich (4×6) surface reconstruction, due to evaporation of As.

Sulphurization by hydrogen sulphide at 350° C. results to a "(4×6)-to-(2×1)" surface periodicity transition: sulphur atoms are bonded exclusively with gallium atoms from the initial (4×6) reconstruction. The (2×1) symmetry of the S—GaAs(2×1) surface has been modelled as the alignment of S—Ga dimers into rows. This sulphur-reconstructed surface is well ordered, thermodynamically stable and electrically neutral.

Investigation of the chemical properties of a 2 nm-thick Al$_2$O$_3$/S—GaAs(001)-(2×1) structure was performed by XPS at a detection angle of 21.875° with respect to the normal of the surface. Deconvolution requires three separate peaks revealing the presence of sulphur. The S-concentration has been estimated to be less than one monolayer. Angle resolved XPS shows that sulphur is located right at the interface between the semiconductor surface and the Al$_2$O$_3$ layer. These measurements also indicate that there is only one chemical configuration present of Ga bonded to As, without gallium or arsenic sub-oxides.

Figure 10:
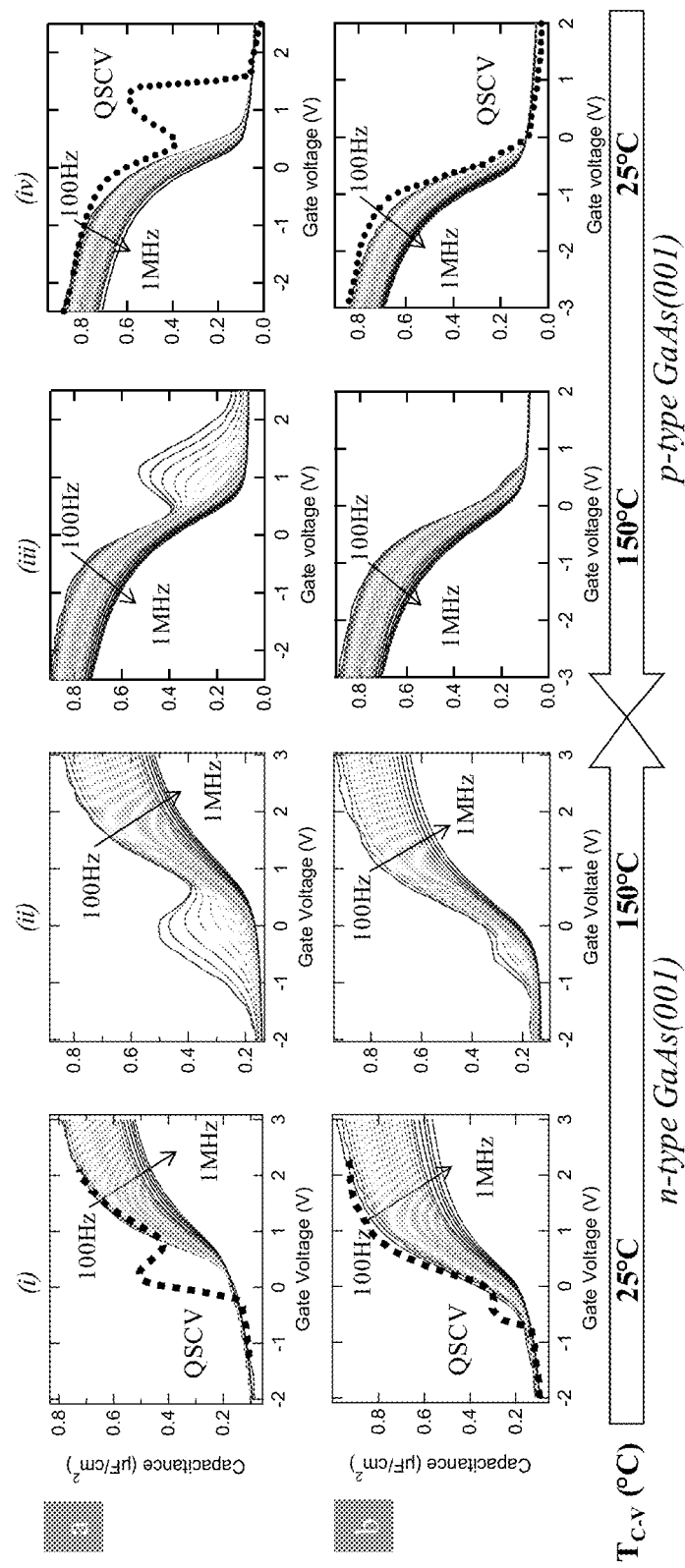
FIG. 10 represents C-V measurements in the dark with frequency range from 100 Hz to 1 MHz of two MOS capacitors on p-type and n-type substrates, corresponding to (a) capacitors without $H_2S$ surface treatment and (b) capacitors with $H_2S$ surface treatment prior to $Al_2O_3$ oxide deposition.

FIG. 10 presents C-V measurements in the dark at varying frequencies (100 Hz to 1 MHz) of two 9 nm-thick Al$_2$O$_3$/GaAs MOS capacitors on p-type and n-type substrates; (a) without- and (b) with in-situ H$_2$S surface treatment. On this figure, room temperature (25° C.) measurements (FIGS. 10($i$) and 10($iv$)) demonstrate almost the same and well-behaved CV characteristics: clear accumulation and depletion behaviour, displaying weak frequency dispersion in the case of p-type capacitors and a larger one for n-type MOSCAP's. But, in standard conditions (25° C. and frequency range from 100 Hz to 1 MHz), only a small region of the whole GaAs bandgap is probed, due to the large energy bandgap and to the low effective conduction and valence band density of states.

Consequently, additional C-V's have been performed at higher temperatures (150° C.) to extract $D_{it}$ near GaAs midgap region (FIGS. 10(ii) and 10(iii)). For sample (a), a large trap-induced capacitance response appears at 423K in depletion for the lower frequencies for both n-type and p-type doped substrates. On the other hand, for the $H_2S$-passivated sample (b), excellent C-V characteristics were demonstrated at high temperatures, exhibiting negligible trap-induced capacitance response in depletion, without neither stretch-out nor frequency dispersion.

In addition, quasi-static C-V measurements (QSCV) were performed at 25° C. in the dark (dotted lines in FIGS. 10(i) and 10(iv)). While the non-treated sample (a) presents an "inversion-like" response at such extremely low frequency, the $H_2S$-treated sample (b) shows no capacitance response in inversion. But the extremely low intrinsic carrier concentration ($n_i$) of about $10^6$ cm$^{-3}$ of GaAs results in long minority carrier response time $T_R$ of GaAs MOS capacitors.

Consequently, the observation of inversion carriers in GaAs MOS capacitors is impossible in quasi-static conditions. This shows that the "inversion-like" response in the QSCV of sample (a) is in fact due to the presence of large trap-induced capacitance response which is not the case for the $H_2S$-passivated GaAs surface.

High interface state density $D_{it}$ calculations, based on the conductance method described by Martens et al. in "IEEE Transactions on Electron Devices 55 (2), 547 (2008)", are then used to evaluate the interface quality.

Figure 11:
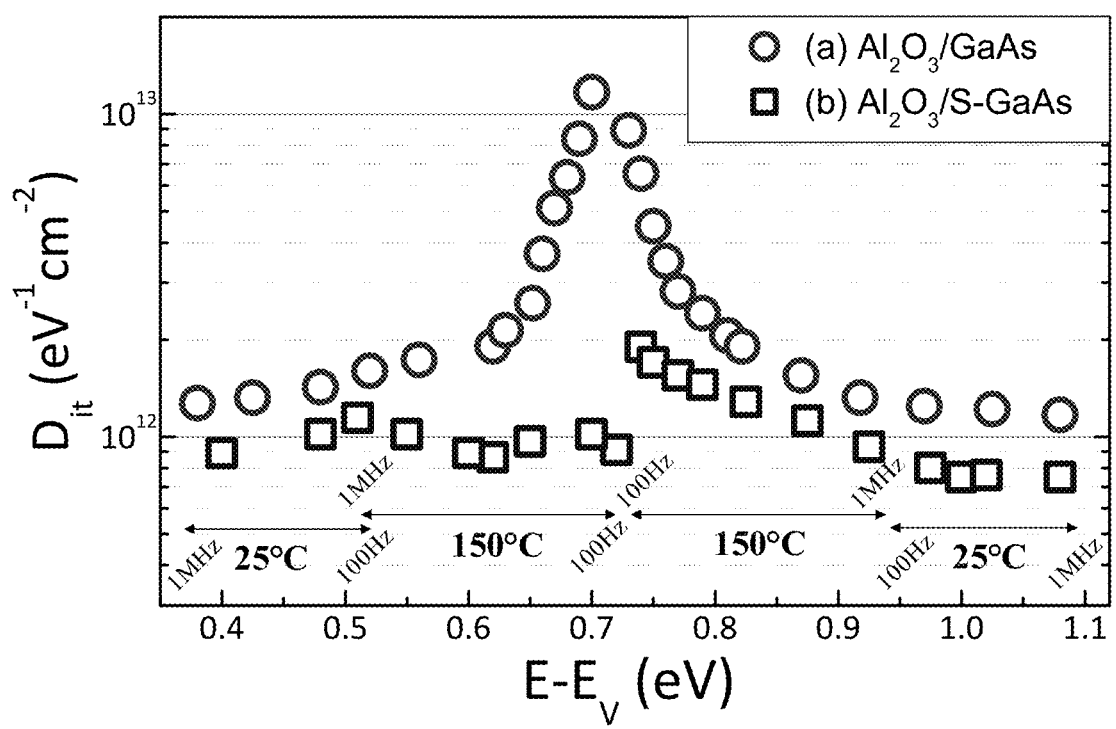
FIG. 11 represents the $D_{it}$ distribution as a function of the energy above the valence-band minimum ($E_v$) for both (a) capacitors without $H_2S$ surface treatment and (b) capacitors with $H_2S$ surface treatment prior to $Al_2O_3$ oxide deposition.

FIG. 11 summarizes the $D_{it}$ distribution as a function of the energy above the valence-band minimum ($E_v$) for both samples. $D_{it}$ curve (-o-) of sample (a) displays a typical GaAs MOS capacitor spectrum with a rise of interface state density at mid-gap region in the $1.5 \times 10^{13}$ eV$^{-1}$ cm$^{-2}$ values. On the contrary, for sample (b), the whole $D_{it}$ spectrum (-□-) lies down in the high $10^{11}$ eV$^{-1}$ cm$^{-2}$ and shows $D_{it}$ max of $2 \times 10^{12}$ eV$^{-1}$ cm$^{-2}$ in midgap. This analyze exhibit a $D_{it}$ reduction of one decade in midgap for the in-situ $H_2S$ treated surface which confirms the effective passivation of GaAs(001).

The invention claimed is:

1. An electronic device having a passivated interface between a dielectric material and a III-V compound, wherein the device comprises:
   a substrate comprising an exposed region comprising a first III-V compound; and thereupon
   a first intermediate layer overlying and in contact with the exposed region;
   a second intermediate layer overlying and in contact with the first intermediate layer;
   a third intermediate layer overlying and in contact with the second intermediate layer;
   a fourth intermediate layer overlying and in contact with the third intermediate layer, wherein the first and the third intermediate layer comprise a third III-V compound selected to have a large band gap, and wherein the second and the fourth intermediate layer comprise a second III-V compound selected to have a narrow band gap;
   a dielectric layer overlying the fourth intermediate layer; and
   at the interface between the second III-V compound and the dielectric, a chalcogenides passivation layer consisting essentially of chalcogenides atom-Group III atom bonds.

2. A device according to claim 1, wherein any of the first III-V compound or the second III-V compound is selected from the group consisting of III-V compounds comprising As, and any combinations or mixtures thereof.

3. A device according to claim 1, wherein each of the first III-V compound and the second III-V compound is independently selected from GaAs, InGaAs, InAs, InAlAs, AlGaAs, GaAsSb, InAlAsSb, InAlAsP, InGaAsP, and any combinations or mixtures thereof.

4. A device according to claim 1, wherein each of the first III-V compound and the second III-V compound is independently selected from InP, InSb, GaSb, AlSb, and any combinations or mixtures thereof.

5. A device according to claim 1, wherein the first III-V compound and the second III-V compound have the same chemical composition.

6. A device according to claim 1, wherein the chalcogenide passivated layer exhibits a (2×1) symmetry.

7. A device according to claim 1, wherein the second III-V compound comprises GaAs.

8. A device according to claim 1, wherein the dielectric layer comprises a high-K dielectric.

9. A device according to claim 8, wherein the high-K dielectric is selected from $Al_2O_3$, $HfO_2$, DyScO, and any combinations or mixtures thereof.

10. A device according to claim 1, wherein the chalcogenide atom is S.

11. A device according to claim 1, wherein the Group III atom is Ga.

12. A device according to claim 1, wherein the chalcogenides atom is S and the Group III atom is Ga.

13. An electronic device having a passivated interface between a dielectric material and a III-V compound, wherein the device comprises:
   a substrate comprising an exposed region comprising a first III-V compound; and thereupon
   at least one intermediate layer comprising a second III-V compound;
   a dielectric layer overlying the at least one intermediate layer comprising the second III-V compound; and
   at the interface between the second III-V compound and the dielectric, a chalcogenides passivation layer consisting essentially of chalcogenides atom-Group III atom bonds,
   wherein each of the first III-V compound and the second III-V compound is independently selected from InP, InSb, GaSb, AlSb, and any combinations or mixtures thereof.

14. A device according to claim 13, wherein the first III-V compound and the second III-V compound have the same chemical composition.

15. A device according to claim 13, wherein the chalcogenide passivated layer exhibits a (2×1) symmetry.

16. A device according to claim 13, wherein the second III-V compound comprises GaAs.

17. A device according to claim 13, wherein the dielectric layer comprises a high-K dielectric.

18. A device according to claim 17, wherein the high-K dielectric is selected from $Al_2O_3$, $HfO_2$, DyScO, and any combinations or mixtures thereof.

19. A device according to claim 13, wherein the chalcogenide atom is S.

20. A device according to claim 13, wherein the Group III atom is Ga.

* * * * *